United States Patent [19]

Strack et al.

[11] 3,793,094

[45] Feb. 19, 1974

[54] FABRICATION OF JUNCTION LASER DEVICES HAVING MODE-SUPPRESSING REGIONS

[75] Inventors: Hans A. Strack, Richardson; George D. Clark, Dallas, both of Tex.

[73] Assignee: Texas Instruments Incorporated, Dallas, Tex.

[22] Filed: Feb. 25, 1971

[21] Appl. No.: 118,982

Related U.S. Application Data

[62] Division of Ser. No. 787,760, Dec. 30, 1968, Pat. No. 3,617,929.

[52] U.S. Cl. .................. 148/189, 148/187, 148/190, 317/235 R, 331/94.5 R

[51] Int. Cl. .................. H01l 7/44

[58] Field of Search .................. 148/189, 187, 190; 317/235 N; 331/94.5 H

[56] References Cited

UNITED STATES PATENTS

| | | | |
|---|---|---|---|
| 3,406,049 | 10/1968 | Marinace | 148/187 X |
| 3,549,434 | 12/1970 | Aven | 148/189 X |
| 3,313,663 | 4/1967 | Yeh et al. | 148/187 |
| 3,298,879 | 1/1967 | Scott et al. | 148/187 |
| 3,215,571 | 11/1965 | Frieser | 148/190 X |

OTHER PUBLICATIONS

Carlsen, "Multiple Diffusion for Integrated Circuit Devices from Single Diffusion", IBM Technical Disclosure Bulletin, Vol. 9, No. 10, pp. 1456–1457, March 1967 TK 7800.I13.

*Primary Examiner*—G. T. Ozaki
*Attorney, Agent, or Firm*—Harold Levine; James O. Dixon; Gary C. Honeycutt

[57] ABSTRACT

A p-n junction laser device having a central lasing region paralleled by p-type regions which serve to suppress transverse lasing modes is prepared from an n-type gallium arsenide crystal by the selective diffusion of zinc, employing a three-layer masking system. The first layer is phosphorus-doped $SiO_2$, substantially impermeable to zinc, patterned to preserve n-type conductivity between the mode-suppressing regions and the central p-type region. The second and third masking layers are $SiO_2$ patterned to reduce excessive build-up of dopant concentrations at the semiconductor surface, and to control the diffusion rates so that the mode-suppressing regions are diffused deeper than the central p-type region.

7 Claims, 4 Drawing Figures

FABRICATION OF JUNCTION LASER DEVICES HAVING MODE-SUPPRESSING REGIONS

Figure 1:
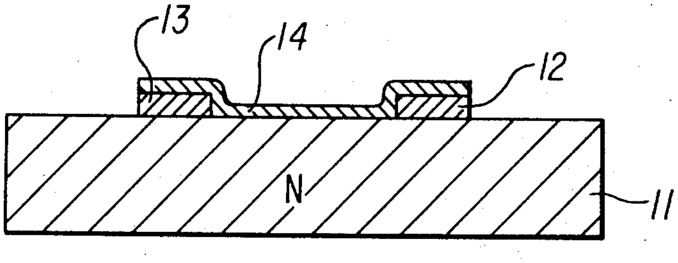

This Application is a division of application Ser. No. 787,760, filed Dec. 30, 1968 now U.S. Pat. No. 3,617,929.

This invention relates to the fabrication of a p-n junction laser device having a lasing region in combination with one or more light absorbing regions which serve to stop or suppress transverse lasing modes; and more particularly to a diffusion technique that permits formation of the lasing region and the mode-stopping regions in the course of a single diffusion step.

Efficient light emission from forward-biased p-n junctions has been observed in a wide variety of direct band gap semiconductor crystals, including particularly gallium arsenide, gallium antimonide, indium phosphide, indium arsenide and indium antimonide. Initially, such observations involved the emission of incoherent or spontaneous light, attributed to intrinsic recombination radiation. Years later, it was discovered that laser action can be induced in these same p-n junctions by providing a forward current exceeding a certain threshold value, and by reflecting a sufficient fraction of the recombination radiation through the region of inverted electron population, i.e., through the p-n junction. Stated otherwise, any spontaneous radiation traveling in the plane of the p-n junction is selectively amplified since it remains in the region of population inversion for a longer time than radiation going in other directions. The stimulated emission of coherent light has been observed in each of the above listed III–V compounds, and in addition has been reported in forward biased p-n junctions fabricated in the following mixed crystals; Ga(AsP), (InGa)As and In(PAs).

P-n junction laser devices have been fabricated by providing an ordinary p-n junction diode in the form of an appropriate optical cavity to obtain sufficient relfectivity to produce stimulated emission. In gallium arsenide, for example, optically flat parallel cavity walls having a sufficient reflectivity are obtained by cleavage along (110) planes. Additional reflectivity has been obtained by silvering one end of the laser crystal, after a thin silicon dioxide layer is deposited, for example, to avoid electrical shorting of the p-n junction. Suitable p-n junctions have generally been obtained by diffusing acceptors into n-type gallium arsenide, for example; but it is also possible to obtain a suitable junction by diffusing donor impurities into p-type gallium arsenide, and other III–V compound semiconductors.

With sufficient stimulation, a lasing p-n junction is capable of emitting coherent light in all directions within the plane of the junction. It is obviously desirable, for certain applications, to provide a directional device by favoring stimulated emission in a desired direction at the expense of all undesired directions. To some degree, this has been achieved by increasing the reflectivity of certain cavity walls and decreasing the reflectivity of other cavity walls. However, a more efficient selection of desired lasing modes is obviously desirable. There is also a considerable incentive to provide more efficient fabrication techniques for the production of laser diodes having a directional output character.

It is one object of the invention to provide a novel process for the fabrication of p-n junction laser devices; and more specifically, to provide an improved diffusion technique especially suited for use in the fabrication of p-n junction laser devices. Still further, it is an object of the invention to provide an improved p-n junction laser device having a central lasing region paralleled by one or more p-type regions which serve to suppress undesired lasing modes.

The invention is embodied in a p-n junction laser device comprising a semiconductor crystal having an n-type region and a first p-type region defining therewith a light emissive p-n junction some portion of which is substantially planar. The structure further includes at least one additional p-type region within the crystal, positioned to intercept some portion of any light emitted from the lasing junction in a direction which contributes to an undesired lasing mode. Typically, the planar portion of the lasing junction is rectangular, and the desired output is emitted within the junction plane, parallel to one pair of opposite sides of the junction. It is therefore desired to suppress all light emitted from the lasing junction in directions transverse to the desired direction. In such a device, the mode-stopping region or regions extend parallel to the selected direction of the laser output, positioned to intercept all light emitted from the lasing junction in the transverse direction. The light absorption coefficient of the p-type semiconductor material is typically at least an order of magnitude greater than that of the n-type material, which accounts for its mode-suppressing character.

The invention is further embodied in a method for the fabrication of a light emissive semiconductor structure, beginning with the step of providing a semiconductor crystal of n-type conductivity with a selective diffusion mask having a first area of a given permeability toward an acceptor impurity, a second area of different permeability to said impurity, spaced apart from said first area by a third area having substantially no permeability to said impurity. The masked crystal is then exposed to the acceptor impurity, at diffusion conditions, for a time sufficient to form two p-type regions, one of which extends deeper into the n-type crystal than the other. The shallower of the two resulting p-n junctions is provided with means for applying a sufficient forward current to generate lasing action, whereas the deeper of the two p-type regions serves as a mode suppressing means positioned to intercept undesired lasing modes. In a preferred embodiment, the diffusion mask is patterned to permit the formation of a rectangular lasing junction paralleled by two separate mode-stopping regions; that is, the diffusion mask has a central rectangular area of reduced permeability to said acceptor impurity with respect to each of two parallel areas on opposite sides of the central rectangular area having a relatively greater permeability to the acceptor impurity, whereby the two mode-stopping p-type regions extend deeper into the crystal than the central lasing junction.

In a more specific embodiment, the process of the invention begins with the step of depositing a first diffusion masking layer, substantially impermeable to a selected acceptor impurity, on a surface of a direct band gap semiconductor crystal of n-type conductivity. For example, a phosphorous-doped layer of silicon dioxide is substantially impermeable to zinc as a selected acceptor impurity, provided, of course, the layer has sufficient thickness, preferably about 2,000 to 4,000 angstroms. A preferred direct band gap semiconductor crystal of n-type conductivity is silicon-doped gallium arsenide; however, any of the above listed III-V compound semiconductors are useful in accordance with the invention and the n-type doping may be provided by tin, tellurium, sulphur, germanium or silicon.

The first diffusion masking layer is then patterned by selective etching to leave on the semiconductor crystal a substantially parallel pair of rectangular strips which serve to ensure a separation of the central lasing region from the transverse mode-suppressing p-type regions on opposite sides thereof.

A second diffusion masking layer is then deposited on said crystal surface and on the remaining portions of the first masking layer. The second layer is preferably undoped silicon dioxide having a thickness of about 200 to 500 angstroms. This material is patterned by selective etching to leave on the crystal a second masking layer covering the rectangular strips which remain from the first deposited layer, and also covering the area of the crystal surface which lies between said strips.

A third masking layer is then deposited, covering the first and second masking layers and extending over at least a portion of the remainder of the crystal surface. The masking layers are now complete, since the deepest diffusion will occur into those regions of the crystal covered by the third dielectric layer only, whereas the region covered by both the second and third layers will receive acceptor atoms at a reduced rate, thereby resulting in a shallower junction. Separation between the central p-type region and the two mode-stopping regions is achieved by the substantially zinc-impermeable masking strips therebetween.

The masked crystal is then exposed to a selected acceptor impurity such as zinc, for example, at diffusion conditions, whereby selective diffusion of the impurity into the crystal occurs through the second and third dielectric layers, but not through the first dielectric layer, and at a relatively greater rate into the regions of the crystal covered by said third dielectric layer only than into the region covered by both said second and third dielectric layers, thereby forming a relatively shallow p-n junction spaced between two relatively deeper p-n junctions. Other acceptor impurities include cadmium or magnesium, but their use does not necessarily produce equivalent results.

Figure 2:
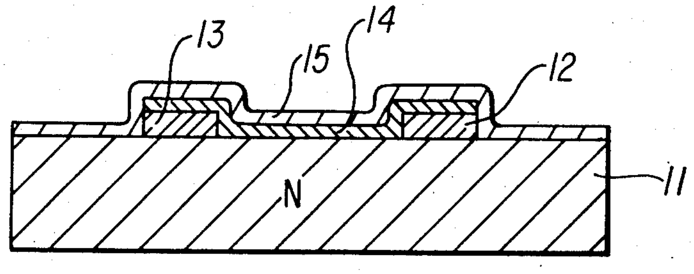
Figure 3:
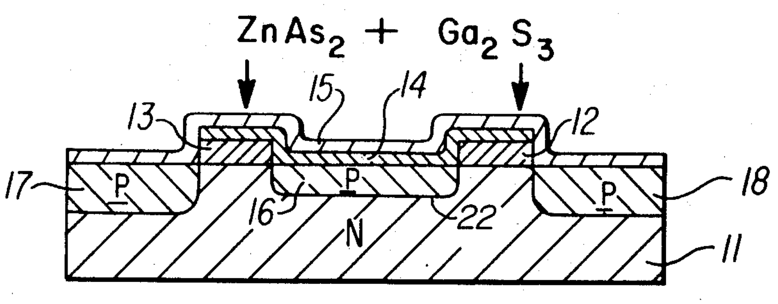

FIGS. 1, 2, and 3 are cross-sectional views of a gallium arsenide semiconductor crystal, showing a sequence of process steps used in a preferred embodiment of the invention.

Figure 4:
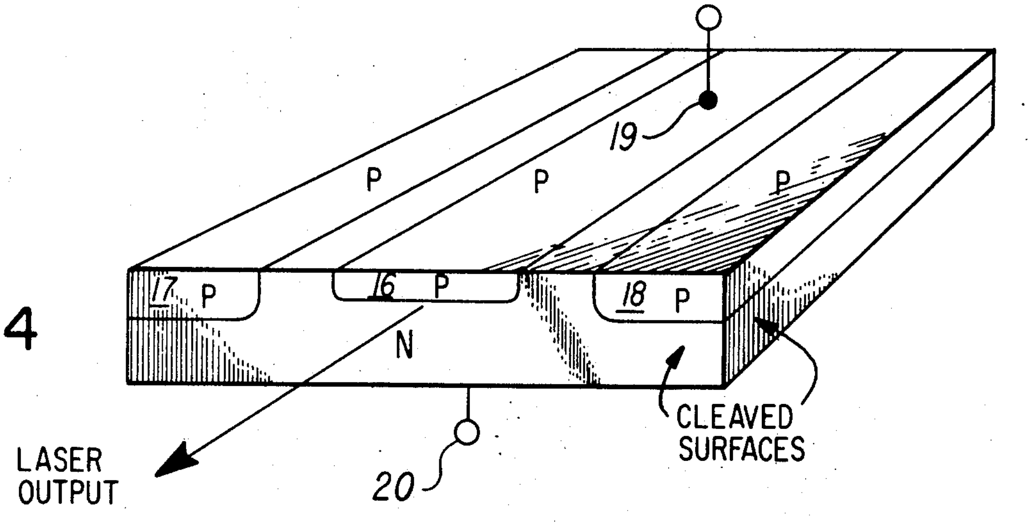

FIG. 4 is an isometric view of a semiconductor structure prepared in accordance with the invention, illustrating the p-n junction geometry of an embodiment of the invention.

FIG. 1

Semiconductor crystal body 11 forms part of gallium arsenide wafer of about one to two square centimeters in area, having a thickness of about 20 mils, cut from a suitable crystal having a uniform n-type conductivity throughout. The crystal is suitably grown in accordance with any known technique. Any suitable donor impurity is used to impart n-type conductivity including elemental tin, tellurium, sulphur, germanium, silicon, or the like. The crystal is grown to yield a wafer having a donor impurity concentration of about $10^{18}$ donor atoms per cubic centimeter, and the wafer is cut to provide a (100) crystal orientation. Other donor impurity concentrations in the range of about $5 \times 10^{17}$ up to $5 \times 10^{18}$ donor atoms per cubic centimeter may be used, as well as other crystal orientations.

Phosphorus-doped silicon dioxide masking strips 12 and 13 are prepared by the vapor deposition of a silicon dioxide layer containing an amount of phosphorus sufficient to provide substantial impermeability to zinc, for example about 0.001 percent to 5.0 percent phosphorus, by any known technique for depositing doped oxides. For example, tetraethylorthosilicate and phosphorus oxychloride ($POCl_3$) are reacted in an oxidizing atmosphere to provide a phosphorus-doped silicon dioxide layer having a thickness of about 3,000 angstroms. By the use of photoresist and selective etching techniques, the phosphorus-doped silicon dioxide layer is patterned to provide parallel strips about 3 mils wide and spaced apart by about 15 mils.

Next, silicon dioxide layer 14 is formed by the deposition of silicon dioxide in the same manner as before, without the phosphorus dopant. Selective etching is then used to pattern a layer covering parallel strips 12 and 13, and also covering that portion of the surface of crystal 11 lying between strips 12 and 13. Layer 14 is about 200 to 300 angstroms thick.

FIG. 2

Oxide layer 15 is then deposited in accordance with the same technique to produce a silicon dioxide layer of about 200 to 300 angstroms thick covering the entire surface of crystal 11, including oxide layers 12, 13 and 14.

FIG. 3

The masked wafer is then transferred to an evacuated diffusion ampoule containing a suitable acceptor dopant. The diffusion source is preferably $ZnAs_2$ plus $Ga_2S_3$ rather than pure zinc or a zinc compund alone. For example, one mg. of each ($ZnAs_2 + Ga_2S_3$) is placed in a 15 c.c. ampoule. The addition of the donor impurity (sulphur) provides a compensation in the active junction region. A similar effect can be obtained by diffusing zinc only and then redistributing zinc atoms in a post-diffusion heat treatment. However, the post-diffusion heat treatment not only represents an additional fabrication step but is also very difficult to control since the proper heat treatment depends on both the starting material and upon the exact diffusion profile produced in the initial diffusion stage. Suitable diffusion conditions include a temperature of about 925° C and a time of about two hours. Other combinations of donor and acceptor impurities may be employed to produce a similar effect. It is essential, of course, that the acceptor impurity predominate in the selected regions of the semiconductor crystal in order to produce the desired p-type conductivity. The next excess of acceptors preferably exceeds $10^{20}$ atoms/cm$^3$. Regions 17 and 18 extend deeper into the crystal than regions 16, since as pointed out earlier, the transverse lasing modes are to be suppressed by the absorption of light emitted from junction 22 in directions transverse to the direction of desired laser output. The different diffusion depths result from the additional thickness of oxide layers covering the central region compared to the oxide thickness covering the parallel regions spaced therefrom. The mode-suppressing regions preferably extend at least 1.0 micron deeper into the crystal than the central p-type region.

Lasers fabricated in accordance with the invention were tested at 100° K. The power output from one end of the laser was measured to be 9.6 watts at a current of 23 amps. The threshold current was 2.8 amps for a laser diode area of 15 by 15 mils square.

FIG. 4

The embodiment illustrated in FIG. 4 has been freed of the oxide masking layers, to point out the p-n junction geometry more clearly. Actually, it is preferred to remove the masking oxide and replace it with fresh oxide, and then to open a suitable windown therein for making ohmic contact to the central p-type region, in accordance with known techniques. For example, a gold-antimony alloy is evaporated uniformly on the surface of the central p-type region, and on the reverse side to establish ohmic contact with the n-type region. Both contacts are then nickel plated, followed by a sintering step at 500°C to 700°C to complete the structure. Electrodes 19 and 20 are shown in the drawing for schematic purposes only, and not to indicate preferred contact geometry.

What is claimed is:

1. A method for the fabrication of a semiconductor structure comprising:

a. providing a III–V compound semiconductor crystal of n-type conductivity with a selective diffusion mask having a first area consisting essentially of $SiO_2$ layer having a first thickness and a second area consisting essentially of a a $SiO_2$ layer having a second thickness substantially greater than said first thickness spaced apart from said first area by a third area consisting essentially of phosphorous-doped $SiO_2$; and b. exposing the masked crystal to a zinc-comprising impurity, at diffusion conditions, for a time sufficient to form a plurality of p-n junctions, one of which extends deeper into said crystal than another.

2. A method as defined by claim 1 wherein said semiconductor crystal is selected from the group consisting of gallium arsenide, gallium antimonide, indium phosphide, indium arsenide, indium antimonide, and mixed crystals including any two of said compounds.

3. A method as defined by claim 1 wherein step (b) includes exposure of said masked crystal to a vaporous mixture of $ZnAs_2$ and $Ga_2S_3$.

4. A method for the fabrication of a p-n junction device comprising:

a. depositing a first diffusion masking layer, substantially impermeable to a selected conductivity type producing impurity, on a surface of a direct band gap semiconductor crystal of opposite conductivity type;

b. selectively removing a portion of said first masking layer to leave on said crystal a substantially parallel pair of masking strips;

c. depositing a second diffusion masking layer on said crystal surface and on said strips;

d. selectively removing a portion of said second masking layer to leave on said crystal a layer covering said elongated strips and covering at least a portion of the area of said crystal surface lying between said strips;

e. depositing a third diffusion masking layer on said crystal surface covering said second masking layer and covering at least a portion of the remainder of said crystal surface; and f. exposing said crystal to said selected impurity, at diffusion conditions, whereby selective diffusion of said impurity into said crystal occurs through said second and third masking layers, but not through said first masking layer, and at a relatively greater rate into the regions of said crystal covered by said third masking layer only than into the region covered by both said second and third masking layers, thereby forming a relatively shallow p-n junction spaced between two relatively deeper p-n junctions.

5. A method as defined by claim 4 wherein said crystal is of n-type conductivity, said first masking layer is phosphorus-doped $SiO_2$, and said impurity is Zn or a compound thereof.

6. A method as defined by claim 5 wherein said phosphorus-doped $SiO_2$ layer is deposited to a thickness of at least 2,000 angstroms, and said second and third masking layers are $SiO_2$ having a thickness of about 200 to 500 angstroms.

7. A method as defined by claim 6 wherein the diffusion source includes $ZnAs_2$ plus $Ga_2S_3$.

* * * * *